United States Patent [19]

Muraki et al.

[11] Patent Number: 4,630,180

[45] Date of Patent: Dec. 16, 1986

[54] LIGHT EMITTING DIODE ARRAY

[75] Inventors: Katsuo Muraki, Yokosuka; Kiyokazu Honda, Zushi; Takaki Watanabe, Imabari, all of Japan

[73] Assignees: Kabushiki Kaisha Toshiba, Kawasaki; Harison Electric Company Limited, Imabari, both of Japan

[21] Appl. No.: 742,511

[22] Filed: Jun. 7, 1985

[30] Foreign Application Priority Data

Jun. 11, 1984 [JP] Japan ............... 59-85548[U]

[51] Int. Cl.⁴ ................................. F21S 1/00
[52] U.S. Cl. ................... 362/223; 362/241; 362/800; 350/433
[58] Field of Search ............ 362/27, 31, 32, 223, 362/224, 235, 240, 241, 244, 245, 340, 800; 350/433

[56] References Cited

U.S. PATENT DOCUMENTS

| 2,356,654 | 8/1944 | Cullman | 362/223 |
| 3,612,855 | 10/1971 | Juhnke | 362/235 |
| 4,177,502 | 12/1979 | Hiscock | 362/218 |
| 4,186,431 | 1/1980 | Engel et al. | 362/223 |
| 4,255,042 | 3/1981 | Armitage, Jr. et al. | 355/3 R |
| 4,344,691 | 8/1982 | Grant et al. | 355/1 |

FOREIGN PATENT DOCUMENTS

| 2757869 | 7/1978 | Fed. Rep. of Germany | 362/32 |
| 1228140 | 3/1960 | France | 350/433 |

Primary Examiner—Samuel Scott
Assistant Examiner—Allen J. Flanigan
Attorney, Agent, or Firm—Schwartz, Jeffery, Schwaab, Mack, Blumenthal & Evans

[57] ABSTRACT

A plurality of light emitting diode pellets arranged on a base are surrounded by a partition member and an outer frame member fixed on the base to mount an elongated lens on the opening portion thereof. A certain number of partition members are arranged between the base and the lens having recessed portions so as to partition each pellet or groups of several pellets. The upper ends of the partition members are inserted into recessed portions of the lens. Thus, when an arbitrary light emitting diode pellet is energized, light from the energized pellet does not spread to the non-light emitting pellet portions, thus clearly discriminating between the light emitting portions and non-light emitting portions.

7 Claims, 7 Drawing Figures

LIGHT EMITTING DIODE ARRAY

BACKGROUND OF THE INVENTION

The present invention relates to a light emitting diode array in which a large number of light emitting diode pellets are arranged for use in exposure light sources for facsimile, exposure light sources or light sources for removing electric charges on a drum in an electronic copy machine, or light sources for display device etc.

For a light source to optically recognize a manuscript in a transmitting unit of a facsimile, or a charge removing light source to remove electric charges charged on a light sensitive drum of an electronic copy machine, an array on which a large number of light emitting diodes (which will be called "LEDs" hereinafter) has been recently used. A plurality of LED pellets linearly arranged on a base are surrounded by partition members and an outer frame member, and an optically focusing lens is provided at the opening portion of the outer frame member.

Such an array has an arrangement such that the lens is fitted into the outer frame member and is mounted on the partition members. Accordingly, the drawback of such an array is that the height from the bottom of the base to the top of the lens is large, resulting in a large-scale of the array, and that an illumination at an radiation surface is lowered as the distance between the LED and the lens is large when using the LEDs having small quantity of light, although a quantity of light is increased according as the number of LEDs is increased.

Further, in a recent electronic copy machine having a reduction function, it is desired to use a light source having a sharp radiating light beam as a blank exposure light source for removing electric charges in blanks of a paper. However, when the above-mentioned array is applied to copy machine, the radiating light beam spreads too much in an arrangement direction of LEDs. As a result, there arises a problem that the boundaries between light emitting areas and non-light emitting areas become indistinct, resulting in occurence of blurred portions when making a copy.

SUMMARY OF THE INVENTION

The present invention has been made so as to contemplate overcoming of the problems in the above-described background of the invention, and has an object to provide a light emitting diode array which can improve an illumination at an radiation surface and become small-sized, and which has a structure such that partition members are firmly fitted into the lens.

A light emitting diode array according to the present invention comprising a plurality of light emitting pellets arranged on a base are surrounded through partition members, an outer frame member, and a lens is arranged on the opening portion of the outer frame member, characterized in that the one ends of the partition members are fitted at recessed portions formed on the lens.

BRIEF DESCRIPTION OF THE DRAWINGS

FIG. 2 is an enlarged view illustrating the essential part of the light emitting array shown in FIG. 1 wherein FIG. 3 is an enlarged view illustrating the essential part of another embodiment of a light emitting diode array according to the present invention wherein

DETAILED DESCRIPTION OF THE PREFERRED EMBODIMENTS

Preferred embodiments according to the present invention will be described with reference to attached drawings.

Figure 1:
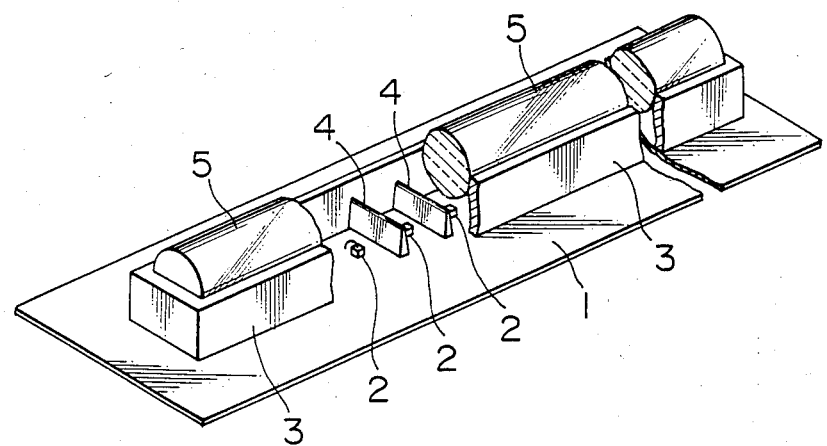
FIG. 1 is a perspective view partially broken illustrating an embodiment of a light emitting diode array according to the present invention.
Figure 2A:
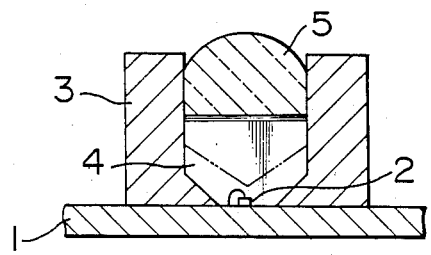
FIG. 2a is a side elevational cross section.
Figure 2B:
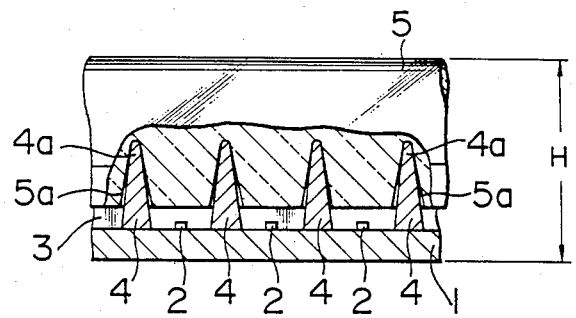
FIG. 2b is a front cross section and FIG. 2c is a top view partially broken.
Figure 2C:
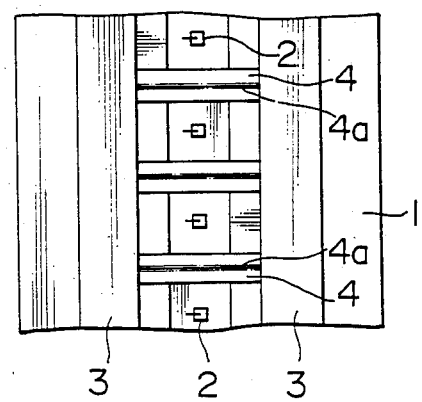

Referring to FIGS. 1 and 2, there is shown a first embodiment of a light emitting diode array comprising an elongated base 1 e.g. a printed wiring board of resin, or a wiring board of metal etc., and a plurality of light emitting diode pellets (which will be called "LED pellets" hereinafter) substantially linearly arranged on the base 1 and bonded thereon. An outer frame member 3 is arranged so as to surround the LED pellet assembly and partition members 4 for partitioning respective LED pellets 2. A rodshaped lens 5 made of transparent resin or glass is mounted on the opening of the outer frame member 3 wherein the lens 5 is formed semicircular in its upper portion and is V-shaped in its lower portion. Moreover, the lens 5 has recessed portions 5a formed at the intermediate portion thereof. The upper end portions of the 4a partition members 4 are inserted and fitted at the recessed portions 5a. The outer frame member 3 and the partition members 4 which are integrally formed with each other by synthetic resin material are fitted on the base 1. Further, the lens 5 is also fixed between the inside of the outer frame member 3 and partition members 4. It is preferable not only to form the inside of the outer frame memter 3 and partition members 4 so as to optically direct light emitted from the LED pellets to the lens 5, but also to allow them to be formed with a reflective surface so as to effectively reflect light.

In the LED array thus formed, each LED pellet can selectively be energized when electric power is supplied thereto through wiring (not shown) provided in the base 1. There are some features in regard to optical behavior of light emitted from the LED pellet 2; First is that it is incident directly to the lens 5; Second is that it is reflected by the outer frame member 3 and the partition member 4 thereafter to be incident upon the lens 5; Third is that it impinges on the end portion 4a of the partition member 4 within the lens 5 thereafter to be radiated to the external of the lens 5. In this instance, the outer frame member 3 and partition members 4 are formed to give directivity to these radiating lights, thus suppressing the spreading thereof.

Figure 3A:
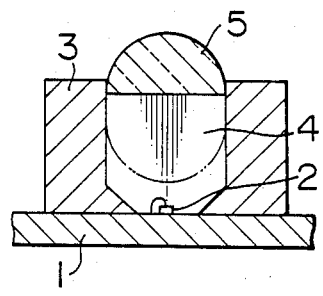
FIG. 3a is a side elevational cross section.
Figure 3B:
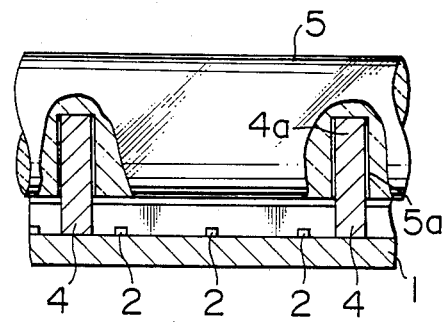
FIG. 3b is a front cross section.

FIG. 3 shows another embodiment of the present invention, wherein the parts identical to those in the first embodiment are designated by the same reference numerals, respectively, and their explanation will be omitted. This embodiment is characterized in that a plurality of LED pellets 2 are arranged on the substrate 1 in a manner such that a certain number of LED pellets 2 (three in this example) are grouped as one block and respective blocks are partitioned by partition members 4. This arrangement is suitable for practical use in that there is no interference between LED pellets provided in adjacent blocks when each LED pellet has low quantity of light.

The present invention is not limited to the above-mentioned embodiments. For instance, the present invention is applicable to an array used in a light source for a display device in which a plurality of pellets are arranged in rows and columns on a base. Further, there may be employed an arrangement such that an n number of LED pellets (n is a positive integer) are grouped as one block in dependance upon a required quantity of light and respective blocks are encompassed by partition members to allow each LED pellet to become on or off. In addition, for means to fix the outer frame and the partition members to the base and the means to mount the lens on the outer frame member, there may be employed welding, bonding or caulking etc. or the combination thereof. Further, instead of the system of integrally forming the outer frame member and the partition members, there may be employed a system of separately forming these members and thereafter assembling them.

Figure 4:
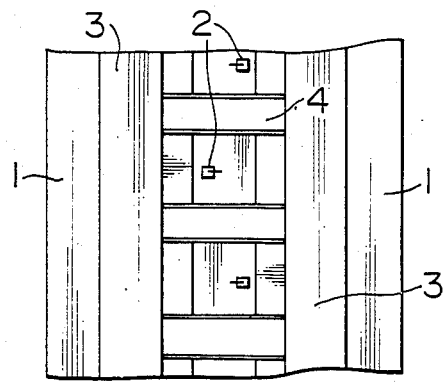
FIG. 4 is a plan view schematically illustrating another arrangement of light emitting diode pellets employed in the present invention.

FIG. 4 shows another arrangement of the LED pellets wherein pellets are arranged in a zigzag form. This arrangement can effectively increase the number of pellets with respect to the length of the LED array, thereby increasing quantity of light emitted.

As stated above, the present invention is characterized in that the LED array comprises a plurality of LED pellets arranged on the base, partition members provided so as to partition LED pellets, respectively, and the lens having recessed portions formed thereon, the recessed portions being inserted and fitted into the end portions of the partition members. Accordingly, the LED array can provide following excellent advantages: First is to reduce the height H from the bottom of the base to the top of the lens, thus enabling facsimile, copy machines, or display devices etc. using the LED array of the present invention to be small-sized. Second is to increase quantity of light because the LED pellets having a low quantity of light can be arranged closure to the radiation surface. Third is that when the LED array of the invention is used as the above-mentioned blank exposure light source, sharp light-screening characteristics can be obtained. Fourth is to provide firm joining between the partition members and the lens because the end portions of the partition members are inserted into recessed portions of the lens.

What is claimed is:
1. A light emitting diode array comprising:
   (a) a base,
   (b) a plurality of light emitting diode pellets arranged on said base,
   (c) an outer frame member having one opening portion fastened to said base so as to surround said light emitting diode pellets,
   (d) a lens having at least one recessed portion provided so as to cover the other opening portion of said outer frame member, and
   (e) at least one partition member provided between said base and said recessed portion of said lens so as to partition said plurality of light emitting diode pellets in an arrangement direction, one end portion of said partition member positioned at the side of said lens being inserted into said recessed portion,
   (f) said partition member being non-light transmitting, whereby off-axis radiation emitted by one of said pellets which would otherwise be transmitted through said lens in said arrangement direction towards an adjacent section of said lens overlying an adjacent pellet will be prevented from being so transmitted, resulting in more clearly defined image boundaries when selected pellets are energized while others are not.

2. A light emitting diode array as set forth in claim 1, wherein said partition member is provided every each adjacent diode pellet.

3. A light emitting diode array as set forth in claim 1, wherein said partition member is provided every plural adjacent diode pellets.

4. A light emitting diode array as set forth in claim 1, wherein said plurality of diode pellets are arranged in a zigzag form.

5. A light emitting diode array as set forth in claim 1, wherein said lens is formed at its lower portion V-shaped in lateral cross section.

6. A light emitting diode array as set forth in claim 1, wherein said lens is formed at its lower portion semicircular in lateral cross section.

7. A light emitting diode array as set forth in claim 1, wherein said lens is formed circular in lateral cross section.

* * * * *